United States Patent
Terasaki et al.

(10) Patent No.: US 9,833,855 B2
(45) Date of Patent: Dec. 5, 2017

(54) METHOD FOR MANUFACTURING POWER MODULE SUBSTRATE

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/772,913

(22) PCT Filed: Mar. 17, 2014

(86) PCT No.: PCT/JP2014/057098
§ 371 (c)(1),
(2) Date: Sep. 4, 2015

(87) PCT Pub. No.: WO2014/148420
PCT Pub. Date: Sep. 25, 2014

(65) Prior Publication Data
US 2016/0016245 A1   Jan. 21, 2016

(30) Foreign Application Priority Data
Mar. 18, 2013 (JP) ................... 2013-055518

(51) Int. Cl.
*B23K 31/02*  (2006.01)
*B23K 1/00*  (2006.01)
(Continued)

(52) U.S. Cl.
CPC .......... *B23K 1/0006* (2013.01); *B23K 1/0016* (2013.01); *B23K 1/19* (2013.01);
(Continued)

(58) Field of Classification Search
None
See application file for complete search history.

(56) References Cited

U.S. PATENT DOCUMENTS 5,561,321 A * 10/1996 Hirano ................ B32B 15/01
257/700
5,807,626 A * 9/1998 Naba .................. B23K 1/0016
174/259

(Continued)

FOREIGN PATENT DOCUMENTS

CN      102922828 A    2/2013
JP   2000-349400 A   12/2000
(Continued)

OTHER PUBLICATIONS

Brazetec 5662 "Technical Data Sheet" (Oct. 11, 2006).*
(Continued)

*Primary Examiner* — Kiley Stoner
(74) *Attorney, Agent, or Firm* — Locke Lord LLP

(57) ABSTRACT

A method for manufacturing a power module substrate includes a first lamination step of laminating a ceramic substrate and a copper sheet through an active metal material and a filler metal having a melting point of 660° C. or lower on one surface side of the ceramic substrate; a second lamination step of laminating the ceramic substrate and an aluminum sheet through a bonding material on the other surface side of the ceramic substrate; and a heating treatment step of heating the ceramic substrate, the copper sheet, and the aluminum sheet laminated together, and the ceramic substrate and the copper sheet, and the ceramic sheet and the aluminum sheet are bonded at the same time.

20 Claims, 4 Drawing Sheets

(51) Int. Cl.

| | | |
|---|---|---|
| *H01L 23/373* | (2006.01) | |
| *C04B 37/02* | (2006.01) | |
| *B23K 1/19* | (2006.01) | |
| *B23K 35/28* | (2006.01) | |
| *B23K 35/30* | (2006.01) | |
| *B23K 35/36* | (2006.01) | |
| *C22C 21/08* | (2006.01) | |
| *H01L 21/48* | (2006.01) | |
| *H01L 23/473* | (2006.01) | |
| *B23K 103/00* | (2006.01) | |
| *B23K 103/10* | (2006.01) | |
| *B23K 103/12* | (2006.01) | |
| *B23K 103/18* | (2006.01) | |

(52) U.S. Cl.
CPC .......... *B23K 35/286* (2013.01); *B23K 35/302* (2013.01); *B23K 35/3611* (2013.01); *C04B 37/026* (2013.01); *C22C 21/08* (2013.01); *H01L 21/4857* (2013.01); *H01L 21/4871* (2013.01); *H01L 23/3735* (2013.01); *B23K 2203/10* (2013.01); *B23K 2203/12* (2013.01); *B23K 2203/18* (2013.01); *B23K 2203/52* (2015.10); *C04B 2237/122* (2013.01); *C04B 2237/124* (2013.01); *C04B 2237/125* (2013.01); *C04B 2237/128* (2013.01); *C04B 2237/366* (2013.01); *C04B 2237/402* (2013.01); *C04B 2237/407* (2013.01); *C04B 2237/72* (2013.01); *C04B 2237/74* (2013.01); *H01L 23/473* (2013.01); *H01L 2224/32225* (2013.01)

(56) References Cited

U.S. PATENT DOCUMENTS

| | | | |
|---|---|---|---|
| 6,310,775 B1 | 10/2001 | Nagatomo | |
| 2003/0091463 A1* | 5/2003 | Izumida | B23K 35/0266 420/560 |
| 2004/0188828 A1* | 9/2004 | Nagatomo | H01L 23/3735 257/703 |
| 2004/0238483 A1* | 12/2004 | Tsukaguchi | C23F 1/20 216/13 |
| 2004/0262367 A1 | 12/2004 | Nakamura | |
| 2005/0136270 A1* | 6/2005 | Besnoin | B23K 1/0016 428/469 |
| 2005/0249629 A1* | 11/2005 | Harris | B23K 35/302 420/472 |
| 2006/0157862 A1* | 7/2006 | Nishimura | H01L 23/3735 257/772 |
| 2007/0007280 A1* | 1/2007 | Bayerer | H01L 23/36 219/604 |
| 2008/0093729 A1* | 4/2008 | Siepe | H01L 23/3735 257/703 |
| 2008/0122052 A1* | 5/2008 | Fukui | B22F 7/04 257/678 |
| 2009/0020321 A1* | 1/2009 | Schulz-Harder | C04B 37/026 174/256 |
| 2009/0243089 A1* | 10/2009 | Hohlfeld | B23K 35/262 257/734 |
| 2010/0147571 A1* | 6/2010 | Kluge | C04B 37/005 174/259 |
| 2010/0175756 A1* | 7/2010 | Weihs | B32B 37/1207 136/259 |
| 2010/0187020 A1* | 7/2010 | Zhang | E21B 10/573 175/428 |
| 2011/0074010 A1* | 3/2011 | Kuromitsu | H01L 23/3735 257/703 |
| 2013/0022836 A1* | 1/2013 | Easley | C04B 37/006 428/622 |
| 2014/0138710 A1* | 5/2014 | Ohtsu | H01L 24/89 257/77 |
| 2015/0034367 A1* | 2/2015 | Nagatomo | H01L 23/36 174/252 |
| 2015/0055302 A1* | 2/2015 | Nagatomo | H01L 23/3735 361/709 |
| 2015/0208496 A1* | 7/2015 | Terasaki | B23K 35/30 361/760 |
| 2015/0282379 A1* | 10/2015 | Terasaki | H01L 21/4882 361/720 |
| 2015/0313011 A1* | 10/2015 | Terasaki | H01L 23/12 428/336 |
| 2016/0001388 A1* | 1/2016 | Oohiraki | C04B 35/645 228/122.1 |
| 2016/0013073 A1* | 1/2016 | Terasaki | C04B 37/026 156/89.18 |
| 2016/0035660 A1* | 2/2016 | Terasaki | B32B 15/01 174/252 |

FOREIGN PATENT DOCUMENTS

| | | | |
|---|---|---|---|
| JP | 3211856 B2 | | 9/2001 |
| JP | 2003-197826 A | | 7/2003 |
| JP | 2005-035874 A | | 2/2005 |
| JP | 2005-050919 A | | 2/2005 |
| JP | 2005052869 A | * | 3/2005 |
| JP | 2008198706 A | * | 8/2008 |
| JP | 2011108999 A | * | 6/2011 |
| JP | 2011-155227 A | | 8/2011 |
| JP | 2012-064801 A | | 3/2012 |
| JP | 2012-136378 A | | 7/2012 |
| JP | 2012-160642 A | | 8/2012 |
| JP | 2012-178513 A | | 9/2012 |
| JP | 2013214561 A | * | 10/2013 |

OTHER PUBLICATIONS

International Search Report dated May 13, 2014, issued for PCT/JP2014/057098 and English translation thereof.
European Search Report, dated Sep. 29, 2016, for EP Application No. 14767678.7.
Notice of Allowance of the Japanese Patent Office, dated Feb. 14, 2017, in corresponding Japanese Patent Application No. 2013-055518.
Search Report dated Mar. 22, 2017, issued for corresponding CN Patent Application No. 201480012586.1, with English translation of part of the search report.

* cited by examiner

METHOD FOR MANUFACTURING POWER MODULE SUBSTRATE

TECHNICAL FIELD

The present invention relates to a method for manufacturing a power module substrate having a circuit layer disposed on one surface of a ceramic substrate and a metal layer disposed on the other surface of the ceramic substrate.

Priority is claimed on Japanese Patent Application No. 2013-055518, filed Mar. 18, 2013, the content of which is incorporated herein by reference.

BACKGROUND ART OF THE INVENTION

In a power semiconductor element for high-power control used to control wind power generation, a transportation system such as an electric automobile and the like, a large amount of heat is generated, and thus, as a substrate mounting the power semiconductor element thereon, for example, a power module substrate in which metal sheets having excellent conductive properties are bonded to both surfaces of a ceramic substrate made of aluminum nitride (AlN) as a circuit layer and a metal layer is widely employed. Furthermore, in the above-described power module substrate, in some cases, a heat sink is bonded to the metal layer side through a solder material.

For example, a power module substrate described in Patent Document 1 has a structure in which copper sheets are bonded to both surfaces of a ceramic substrate. In such a power module substrate, the copper sheets are bonded to both surfaces of the ceramic substrate by disposing the copper sheets on the surfaces through an Ag—Cu—Ti-based brazing filler metal and carrying out a heating treatment.

In a case in which the metal layer and the heat sink in the power module substrate disclosed in Patent Document 1 are bonded together through the solder material, the loading of a thermal cycle causes the generation of thermal stress due to the difference in thermal expansion coefficient between the power module substrate and the heat sink. However, since the metal layer is made of copper having strong deformation resistance, it is not possible to absorb the thermal stress through the deformation of the metal layer, and thus there is a concern that cracks may be generated in the ceramic substrate.

Therefore, Patent Document 2 proposes a power module substrate in which a copper sheet is bonded to one surface of a ceramic substrate so as to form a circuit layer and an aluminum sheet is bonded to the other surface so as to form a metal layer. In a case in which the metal layer of this power module substrate and a heat sink are bonded together, thermal stress generated between the power module substrate and the heat sink due to the loading of a thermal cycle is absorbed by the metal layer made of aluminum having relatively small deformation resistance, and thus it is possible to suppress the generation of cracks in the ceramic substrate.

In the power module substrate described in Patent Document 2, a heating treatment is carried out with a Ag—Cu—Ti-based brazing filler metal interposed on one surface of the ceramic substrate so as to bond the copper sheet, and then another heating treatment is carried out with an Al—Si-based brazing filler metal interposed on the other surface of the ceramic substrate so as to bond the aluminum sheet.

PRIOR ART DOCUMENTS

Patent Documents

Patent Document 1: Japanese Patent No. 3211856
Patent Document 2: Japanese Unexamined Patent Application, First Publication No. 2003-197826

SUMMARY OF THE INVENTION

Technical Problem

As disclosed in Patent Documents 1 and 2, when the ceramic substrate and the copper sheet are bonded together using the Ag—Cu—Ti-based brazing filler metal, there is a problem in that the high melting point of the Ag—Cu—Ti-based brazing filler metal causes the degradation of the ceramic substrate due to heat.

In addition, there is another problem in that the inclusion of expensive Ag in the Ag—Cu—Ti-based brazing filler metal causes an increase in the manufacturing cost.

In addition, since the Ag—Cu—Ti-based brazing filler metal has a melting point higher than the melting point of the aluminum sheet, when the copper sheet is bonded to one surface of the ceramic substrate through the Ag—Cu—Ti-based brazing filler metal, and the aluminum sheet is bonded to the other surface of the ceramic substrate through the Al—Si-based brazing filler metal as in the power module substrate disclosed in Patent Document 2, it is necessary to bond the copper sheet first and then bond the aluminum sheet. That is, there is a problem in that, in order to form the circuit layer and the metal layer, it is necessary to carry out bonding two times, and thus the manufacturing steps become complicated, the manufacturing time increases, and the manufacturing cost becomes high. Furthermore, since the thermal treatment is carried out twice during bonding, there is another concern that the thermal load applied to the ceramic substrate may increase, the ceramic substrate may significantly warp, and cracks may be generated in the ceramic substrate.

The present invention is made in consideration of the above-described circumstances and an object of the invention is to provide a method for manufacturing a power module substrate in which a copper sheet and an aluminum sheet can be simultaneously bonded to both surfaces of a ceramic substrate at low temperature and low manufacturing cost.

Solution to Problem

According to an aspect of the present invention, a method is provided for manufacturing a power module substrate including a ceramic substrate, a circuit layer formed of a copper sheet bonded onto one surface of the ceramic substrate, and a metal layer formed of an aluminum sheet bonded onto the other surface of the ceramic substrate, in which the method including a first lamination step of laminating the copper sheet on the one surface of the ceramic substrate through an active metal material and a filler metal having a melting point of 660° C. or lower, a second lamination step of laminating the aluminum sheet on the other surface of the ceramic substrate through a bonding material, and a heating treatment step of heating the ceramic substrate, the copper sheet, and the aluminum sheet laminated together, wherein the ceramic substrate and the copper sheet, and the ceramic sheet and the aluminum sheet are bonded at the same time.

In the present invention, the melting point refers to the solidus temperature. In addition, in the present invention, the filler metal refers to a brazing filler metal, a solder material or the like.

According to the method for manufacturing a power module substrate of the present invention, the copper sheet is laminated on one surface side of the ceramic substrate and through an active metal material and a filler metal having a melting point of 660° C. or lower, and the copper sheet laminated on the ceramic substrate is heated together with the aluminum sheet laminated on the ceramic substrate. During the heating treatment, the active metal is melted into the molten liquid-phase filler metal, the wettability of the liquid-phase filler metal to the ceramic substrate is enhanced, and the copper sheet is suitably bonded to the ceramic substrate through the filler metal after the filler metal is solidified.

It may be preferable that the melting point of the filler metal is 600° C. or lower.

In addition, since the melting point of the filler metal is set to 660° C. or lower, it is possible to form the liquid-phase filler metal at a temperature lower than in a case in which the Ag—Cu—Ti-based filler metal is used. When a heating treatment is carried out in the above-described low-temperature range, it is possible to mitigate the thermal load on the ceramic substrate.

Furthermore, since the ceramic substrate and the copper sheet are bonded together using a filler metal not containing Ag, it is possible to further reduce the manufacturing cost compared with a case in which a Ag—Cu—Ti-based brazing filler metal is used.

In the first lamination step, the filler metal may be disposed on the ceramic substrate, and the active metal material may be disposed on the copper sheet.

In the above-described case, it is possible to bond the copper sheet and the active metal material through solid-phase diffusion bonding during the heating treatment, and it becomes possible to suppress the generation of bumps on the bonding interface caused by the generation of the liquid phases of Cu and the active metal and a change in the thickness. In addition, since the active metal material is interposed between the liquid-phase filler metal and the copper sheet, the liquid-phase filler metal does not come into direct contact with the copper sheet, and it is possible to reliably suppress the generation of bumps on the bonding interface and a change in the thickness.

As described above, since the filler metal is suitably bonded to the ceramic substrate, and the active metal material and the copper sheet are bonded together through solid-phase diffusion bonding, it is possible to suitably bond the ceramic substrate and the copper sheet under low-temperature conditions, and it is possible to suppress the thermal degradation of the ceramic substrate.

In the above-described method for manufacturing a power module substrate, the filler metal may be a brazing filler metal having a liquidus temperature of 450° C. or higher.

Specifically, the brazing filler metal may be any one selected from a Cu—P—Sn—Ni-based brazing filler metal, a Cu—Sn-based brazing filler metal, and a Cu—Al-based brazing filler metal.

In a case in which the above-described brazing filler metal is used, it is possible to reliably bond the ceramic substrate and the copper substrate under low-temperature conditions due to the low melting point of the brazing filler metal.

In the above-described method for manufacturing a power module substrate, the filler metal may be a solder material having a liquidus temperature of lower than 450° C.

Specifically, the solder material may be a Cu—P—Sn—Ni-based solder material or a Cu—Sn-based solder material.

In a case in which the above-described solder material is used, the solder material has a lower melting point than the brazing filler metal, and thus it is possible to bond the ceramic substrate and the copper sheet under a lower temperature condition.

Furthermore, since the copper sheet can be bonded to one surface of the ceramic substrate at low temperature as described above, it is possible to bond the aluminum sheet to the other surface of the ceramic substrate at the same time. As described above, since the copper sheet and the aluminum sheet are bonded to both surfaces of the ceramic substrate at the same time, it is possible to simplify the manufacturing steps, shorten the manufacturing time, and reduce the manufacturing cost. Furthermore, since the copper sheet and the aluminum sheet can be bonded to the ceramic substrate at the same time by carrying out the heat treatment only once, compared with a case in which the copper sheet and the aluminum sheet are separately bonded to the ceramic substrate, it is possible to reduce the thermal load applied to the ceramic substrate, mitigate the warping of the ceramic substrate, and suppress the generation of cracks in the ceramic substrate.

In the method for manufacturing a power module substrate, the active metal material may be a Ti material. In such a case, Ti is melted into the liquid-phase filler metal, and thus the surface of the ceramic substrate can be reliably wet with the liquid-phase filler metal, the Ti material and the copper sheet can be bonded together through solid-phase diffusion bonding, and it becomes possible to reliably bond the ceramic substrate and the copper sheet.

Advantageous Effects of the Invention

According to the present invention, it is possible to provide a method for manufacturing a power module substrate in which a copper sheet and an aluminum sheet can be simultaneously bonded to both surfaces of a ceramic substrate at low temperature and low manufacturing cost.

DESCRIPTION OF EMBODIMENTS

Hereinafter, embodiments of the present invention will be described with reference to the accompanying drawings.

Figure 1:
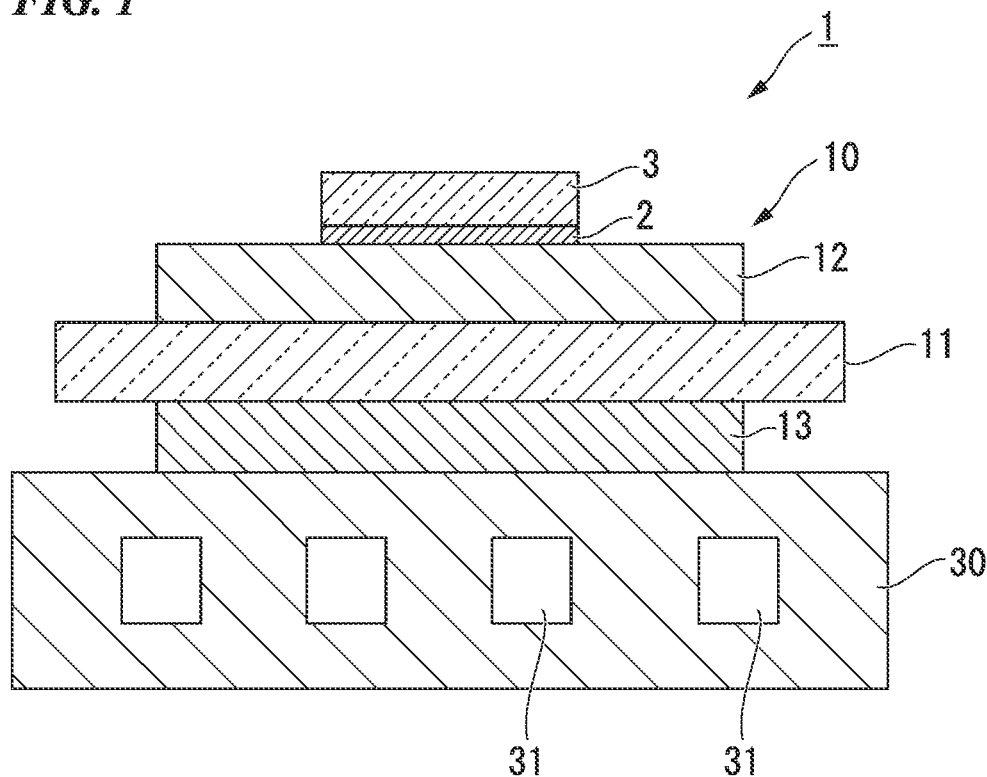
FIG. 1 is a schematic explanatory view of a power module for which a power module substrate according to an embodiment of the present invention is used.

FIG. 1 illustrates a power module 1 including a power module substrate 10 according to the present embodiment.

This power module 1 includes the power module substrate 10 provided with a circuit layer 12, a semiconductor element 3 bonded to one surface (the upper surface in FIG. 1) of the circuit layer 12 through a bonding layer 2, and a heat sink 30 disposed on the other side (the lower side in FIG. 1) of the power module substrate 10.

Figure 2:
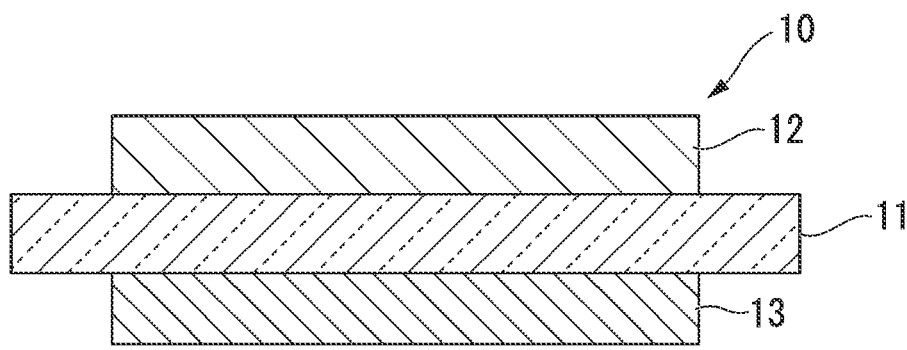
FIG. 2 is a schematic explanatory view of the power module substrate according to the embodiment of the present invention.

As illustrated in FIG. 2, the power module substrate 10 includes a ceramic substrate 11, the circuit layer 12 disposed on one surface (the upper surface in FIG. 2) of the ceramic substrate 11, and a metal layer 13 disposed on the other surface (the lower surface in FIG. 2) of the ceramic substrate 11.

The ceramic substrate 11 is made of a highly insulating ceramic material such as aluminum nitride (AlN), silicon nitride ($Si_3N_4$), or alumina ($Al_2O_3$). In the present embodiment, the ceramic substrate is made of aluminum nitride (AlN) having excellent heat-dissipating properties. In addition, the thickness of the ceramic substrate 11 is set in a range of 0.2 mm to 1.5 mm and, in the present embodiment, is set to 0.635 mm.

The circuit layer 12 is formed by bonding a conductive metal sheet of copper or a copper alloy to one surface of the ceramic substrate 11. In the present embodiment, the circuit layer 12 is formed by bonding a rolled sheet of copper having a purity of 99.99% by mass or greater. The thickness of the circuit layer 12 is set in a range of 0.1 mm to 1.0 mm and, in the present embodiment, is set to 0.3 mm.

The metal layer 13 is formed by bonding a metal sheet of aluminum or an aluminum alloy to the other surface of the ceramic substrate 11. In the present embodiment, the metal layer 13 is formed by bonding a rolled sheet of aluminum having a purity of 99.99% by mass or greater. The thickness of the metal layer 13 is set in a range of 0.1 mm to 3.0 mm and, in the present embodiment, is set to 1.6 mm.

The semiconductor element 3 is made of a semiconductor material such as Si. The semiconductor element 3 and the circuit layer 12 are bonded together through the bonding layer 2.

As the bonding layer 2, for example, a Sn—Ag-based solder material, a Sn—In-based solder material, or a Sn—Ag—Cu-based solder material is used.

The heat sink 30 is a device for dissipating heat from the above-described power module substrate 10. In the present embodiment, the heat sink 30 is made of aluminum or an aluminum alloy and, in the present embodiment, is made of A6063 (an aluminum alloy). The heat sink 30 is provided with flow paths 31 for the flow of a cooling fluid. The heat sink 30 and the metal layer 13 are bonded together through an Al—Si-based brazing filler metal.

Figure 3:
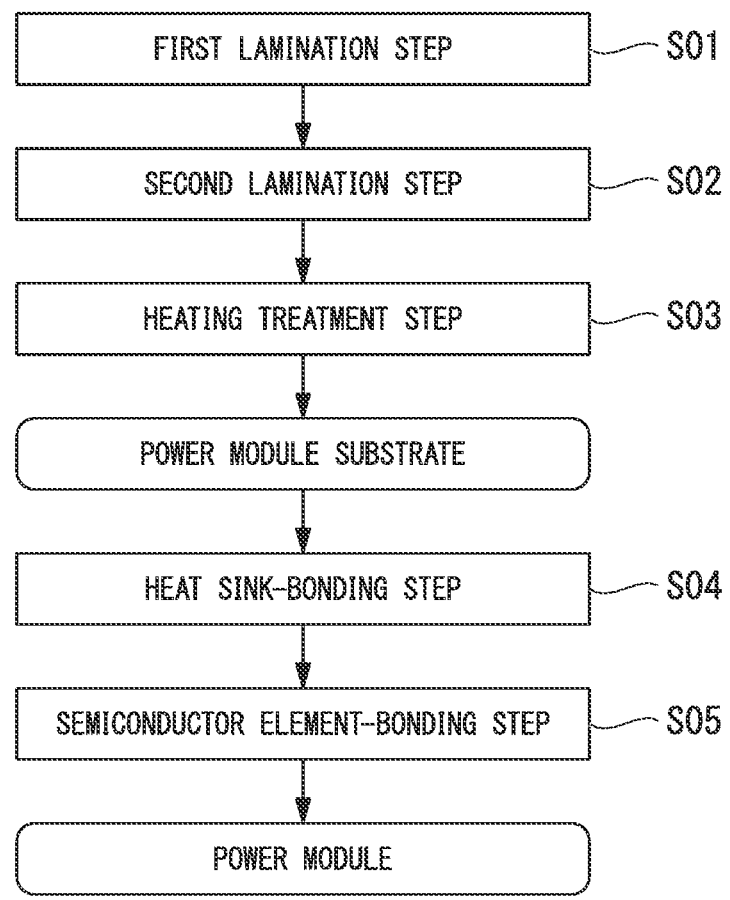
FIG. 3 is a flowchart illustrating a method for manufacturing the power module substrate according to the embodiment of the present invention and a method for manufacturing the power module.

Next, a method for manufacturing the power module 1 according to the present embodiment will be described with reference to the flowchart of FIG. 3 and FIG. 4.

Figure 4:
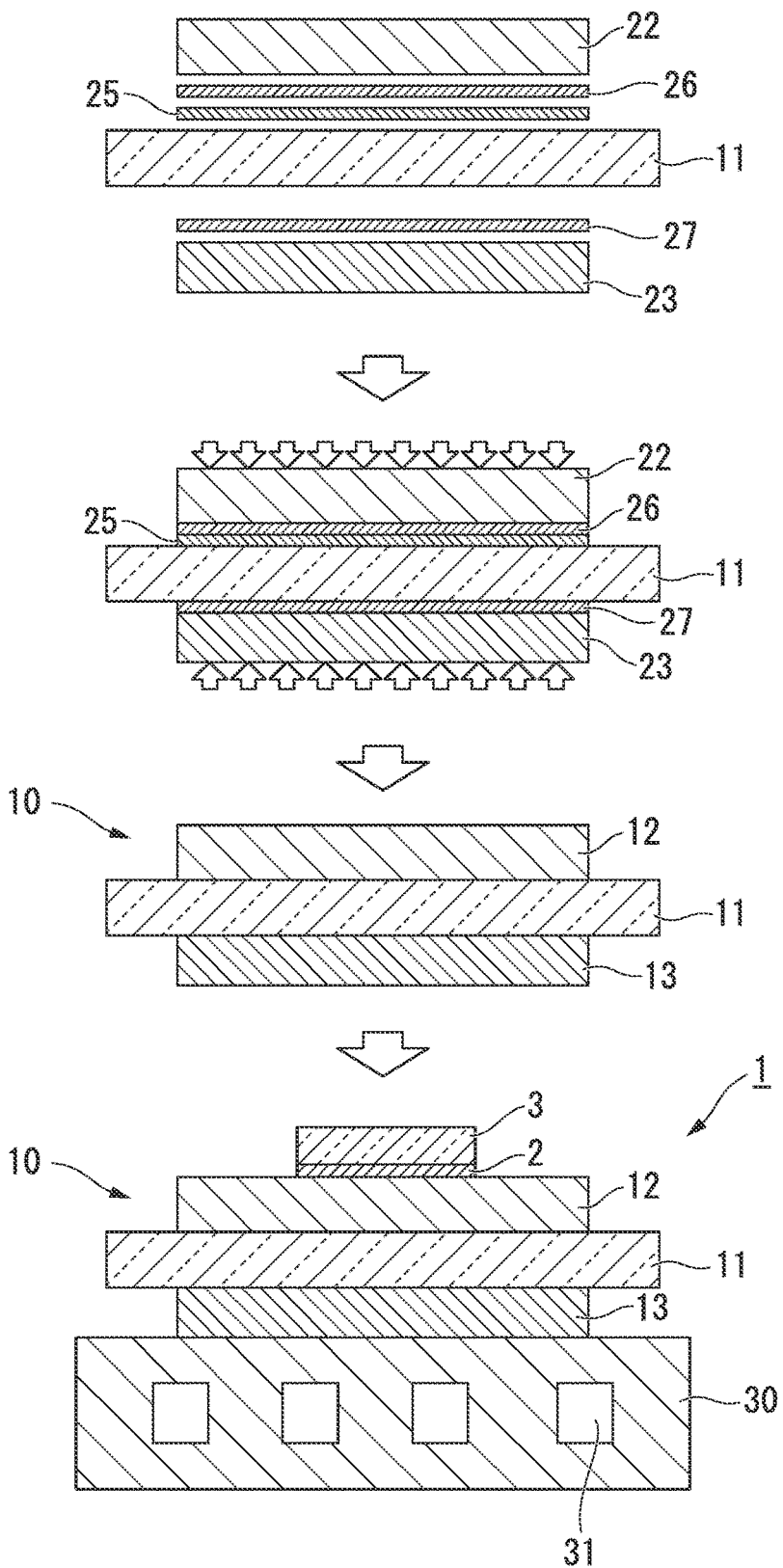
FIG. 4 is a schematic explanatory view of the method for manufacturing the power module substrate according to the embodiment of the present invention and the method for manufacturing the power module.

First, as illustrated in FIG. 4, a filler metal 25, an active metal material 26, and a copper sheet 22 serving as the circuit layer 12 are sequentially laminated on one surface (the upper surface in FIG. 4) of the ceramic substrate 11 (first lamination step S01), and a bonding material 27 and an aluminum sheet 23 serving as the metal layer 13 are sequentially laminated on the other surface (the lower surface in FIG. 4) of the ceramic substrate 11 as illustrated in FIG. 4 (second lamination step S02). That is, the filler metal 25 is disposed on a ceramic substrate 11 side and the active metal material 26 is disposed on a copper sheet 22 side between the ceramic substrate 11 and the copper sheet 22, and the bonding material 27 is disposed between the ceramic substrate 11 and the aluminum sheet 23.

As the filler metal 25, a Cu—P—Sn—Ni-based brazing filler metal, a Cu—Sn-based brazing filler metal, a Cu—Al-based brazing filler metal, a Cu—P—Sn—Ni-based solder material, or a Cu—Sn-based solder material, which has a melting point of 660° C. or lower, is used. In addition, the melting point may be desirably set to 600° C. or lower. In the present embodiment, a Cu—P—Sn—Ni-based brazing filler metal foil (Cu-7 mass % P-15 mass % Sn-10 mass % Ni) is used as the filler metal 25. The thickness of the filler metal 25 is set in a range of 5 μm to 150 μm.

The active metal material 26 contains one or more active elements such as Ti, Zr, Nb, and Hf, and, in the present embodiment, a Ti foil is used as the active metal material 26. The thickness of the active metal material 26 is set in a range of 1 μm to 20 μm.

As the bonding material 27, in the present embodiment, an Al—Si-based brazing filler metal containing Si, which is a melting point-lowering element, is used and, specifically, an Al-7.5 mass % Si brazing filler metal is used.

Next, the ceramic substrate 11, the filler metals 25, the active metal materials 26, the copper sheet 22, the bonding material 27, and the aluminum sheet 23 are loaded and heated in a vacuum heating furnace in a state of being pressurized in the lamination direction at 1 $kgf/cm^2$ to 35 $kgf/cm^2$ (98 kPa to 3430 kPa) (heating treatment step S03). In the present embodiment, the pressure in the vacuum heating furnace is set in a range of $10^{-6}$ Pa to $10^{-3}$ Pa, the heating temperature is set in a range of 600° C. to 650° C., and the heating time is set in a range of 30 minutes to 360 minutes.

In the heating treatment step S03, the active metal material 26 (Ti foil) and the copper sheet 22 are bonded together through solid-phase diffusion bonding, and the ceramic substrates 11 and the active metal material 26 are bonded together through the filler metal 25 in a manner in which the filler metal 25 is melted so as to form a liquid phase and the liquid phase is solidified. In addition, in the heating treatment step S03, the ceramic substrates 11 and the aluminum sheet 23 are bonded together through the bonding material 27 in a manner in which the bonding material 27 is melted so as to form a liquid phase and the liquid phase is solidified.

The bonding surfaces of the active metal material 26 and the copper sheet 22, which are bonded together through solid-phase diffusion bonding, are already worked into flat surfaces.

Therefore, the circuit layer 12 is formed on one surface of the ceramic substrate 11, and the metal layer 13 is formed on the other surface of the ceramic substrate 11, thereby manufacturing the power module substrate 10 of the present embodiment.

Next, the heat sink 30 is bonded to the lower surface of the metal layer 13 in the power module substrate 10 through an Al—Si-based brazing filler metal (heat sink-bonding step S04).

Next, the semiconductor element 3 is bonded to the upper surface of the circuit layer 12 in the power module substrate 10 through a solder material (semiconductor element-bonding step S05).

Thereby, the power module 1 according to the present embodiment is manufactured.

According to the method for manufacturing a power module substrate according to the present embodiment, since the heating treatment is carried out in a state in which the filler metal 25 having a melting point of 660° C. or lower is disposed on the ceramic substrate 11 side and the active metal material 26 (Ti foil in the present embodiment) is disposed on the copper sheet 22 side between the ceramic substrate 11 and the copper sheet 22, during heating, Ti is melted into the molten liquid-phase filler metal 25, the wettability of the liquid-phase filler metal 25 to the ceramic substrate 11 is enhanced, and the copper sheet 22 is bonded to the ceramic substrate 11 through the filler metal 25 after the filler metal 25 is solidified, whereby favorable bonding reliability is obtained.

In addition, in the present embodiment, since the active metal material 26 and the copper sheet 22 are heated and held at a temperature in a range of 600° C. to 650° C. in a state of being laminated and pressurized, it is possible to bond the active metal material 26 and the copper sheet 22 through solid-phase diffusion bonding by diffusing Ti atoms in the active metal material 26 into the copper sheet 22 and diffusing copper atoms in the copper sheet 22 into the active metal material 26.

In a case in which the heating temperature is 600° C. or higher, the diffusion of Ti atoms in the active metal materials 26 and copper atoms in the copper sheet 22 is accelerated, and thus it is possible to sufficiently diffuse the Ti atoms and the copper atoms in a solid phase within a short period of time. In addition, in a case in which the heating temperature is 650° C. or lower, it is possible to suppress the generation of bumps on the bonding interface caused by the generation of a liquid phase between the active metal material 26 and the copper sheet 22 and a change in the thickness. Therefore, the heating temperature is set in the above-described range.

In addition, in the heating treatment step S03, in a case in which the pressure applied in the lamination direction is 1 kgf/cm$^2$ (98 kPa) or higher, the active metal material 26 and the copper sheet 22 can be sufficiently bonded together, and it is possible to suppress the generation of voids between the active metal material 26 and the copper sheet 22. In addition, in a case in which the pressure applied is 35 kgf/cm$^2$ (3430 kPa) or lower, it is possible to suppress the generation of cracks in the ceramic substrate 11. Therefore, the pressure applied is set in the above-described range.

In addition, since the melting point of the filler metal 25 is set to 660° C. or lower, it is possible to form the liquid-phase filler metal at a lower temperature than in a case in which a Ag—Cu—Ti-based brazing filler metal is used.

In addition, since the active metal material 26 is interposed between the filler metal 25 and the copper sheet 22, the liquid-phase filler metal 25 does not come into direct contact with the copper sheet 22, and it is possible to suppress the generation of bumps on the bonding interface and a change in the thickness.

Furthermore, since the surfaces to be bonded of the active metal material 26 and the copper sheet 22 are already worked into flat surfaces, it is possible to suppress the generation of voids in the bonding interface, and the active metal material 26 and the copper sheet 22 can be reliably bonded together.

As described above, since the filler metal 25 is suitably bonded to the ceramic substrate 11, and the active metal material 26 and the copper sheet 22 are bonded together through solid-phase diffusion bonding, it is possible to suitably bond the ceramic substrate 11 and the copper sheet 22 and improve the bonding reliability between the ceramic substrate 11 and the circuit layer 12.

Furthermore, since the ceramic substrate 11 and the copper sheet 22 are bonded together using the filler metal 25 not containing Ag, it is possible to reduce the manufacturing cost more than in a case in which the Ag—Cu—Ti-based brazing filler metal is used.

Furthermore, since the copper sheet 22 can be bonded to one surface of the ceramic substrate 11 at low temperature as described above, it is possible to bond the copper sheet 22 to one surface of the ceramic substrate 11 and the aluminum sheet 23 to the other surface of the ceramic substrate at the same time.

As described above, when the copper sheet 22 and the aluminum sheet 23 are bonded to both surfaces of the ceramic substrate 11 at the same time, it is possible to simplify the manufacturing steps, shorten the manufacturing time, and reduce the manufacturing cost. Furthermore, since the copper sheet 22 and the aluminum sheet 23 can be bonded to the ceramic substrate by carrying out the heat treatment only once, compared with a case in which the copper sheet 22 and the aluminum sheet 23 are separately bonded to the ceramic substrate, it is possible to reduce the thermal load applied to the ceramic substrate 11, mitigate the warping of the ceramic substrate 11, and suppress the generation of cracks in the ceramic substrate 11.

In addition, according to the power module substrate 10 and the power module 1 of the present embodiment, since the circuit layer 12 made of the copper sheet 22 is formed on one surface of the ceramic substrate 11, it is possible to spread and dissipate heat from the semiconductor element 3 toward the ceramic substrate 11. In addition, since the copper sheet 22 has strong deformation resistance, when a heat cycle is loaded, the deformation of the circuit layer 12 is suppressed, the deformation of the bonding layer 2 bonding the semiconductor element 3 and the circuit layer 12 is suppressed, and the bonding reliability can be improved.

In addition, since the metal layer 13 made of the aluminum sheet 23 is formed on the other surface of the ceramic substrate 11, thermal stress generated between the power module substrate 10 and the heat sink 30 during the loading of a thermal cycle is absorbed by the metal layer 13, and thus it is possible to suppress the generation of cracks in the ceramic substrate 11.

Thus far, the embodiments of the present invention have been described, but the present invention is not limited thereto and can be modified in an appropriate manner within the scope of the technical concept of the present invention.

Figure 5:
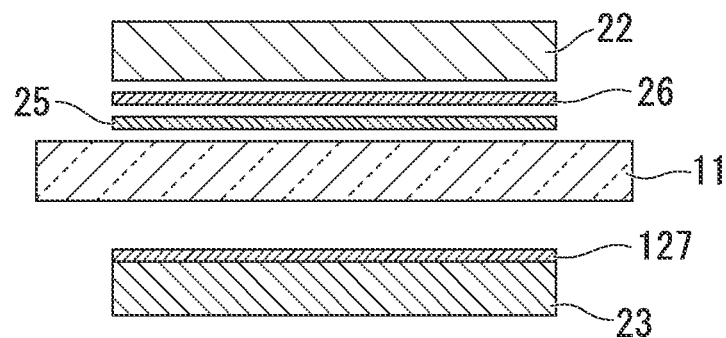
FIG. 5 is a schematic explanatory view of a power module for which a power module substrate according to another embodiment of the present invention is used.

In the above-described embodiments, the case in which the ceramic substrate and the aluminum sheet are bonded together through the Al—Si-based brazing filler metal as the bonding material has been described, but the bonding method is not limited thereto, and the ceramic substrate and the aluminum sheet may be bonded together by applying, for example, a transient liquid phase (TLP) bonding method. In the transient liquid phase bonding method, as illustrated in FIG. 5, additive elements such as Si and Cu are fixed to the bonding surface of the aluminum sheet 23 with the ceramic substrate 11 using a sputtering method so as to form a fixation layer 127, then, the ceramic substrate 11 and the aluminum sheet 23 are laminated together and pressurized in the lamination direction, and a heating treatment is carried out, whereby the ceramic substrate 11 and the aluminum sheet 23 can be bonded together. That is, in the transient liquid phase bonding method, the ceramic substrate 11 and the aluminum sheet 23 are laminated together through the fixation layer 127 serving as the bonding material, and the copper sheet 22 and the aluminum sheet 23 can be bonded to the ceramic substrate at the same time.

In the transient liquid phase bonding method, the pressure during the pressurization in the lamination direction is set in a range of 1 kgf/cm$^2$ (98 kPa) to 35 kgf/cm$^2$ (3430 kPa). In addition, the heating temperature and the heating time in the heating treatment are set in a range of 600° C. to 650° C. and in a range of 30 minutes to 360 minutes respectively.

As the additive elements for the fixation layer, additive elements such as Zn, Ge, Ag, Mg, Ca, Ga, and Li may be used in addition to Si and Cu.

Figure 6:
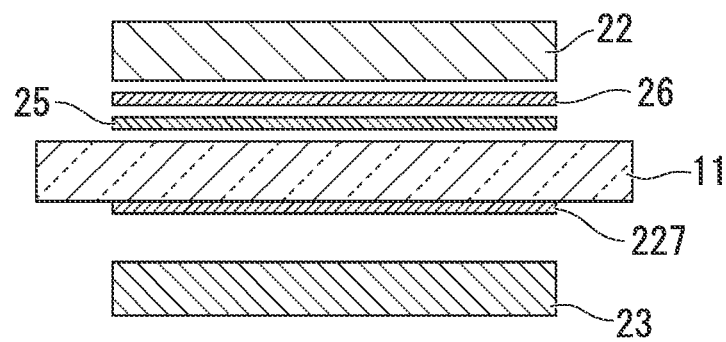
FIG. 6 is a schematic explanatory view of a method for manufacturing a power module substrate according to the other embodiment of the present invention.

In addition, the ceramic substrate and the aluminum sheet can be bonded together using metal paste containing metal particles and an organic substance as the bonding material. Examples of the metal paste include Ag paste containing Ag particles and an organic substance. Specifically, the copper sheet 22 and the aluminum sheet 23 can be bonded to the ceramic substrate 11 at the same time by applying Ag paste 227 onto the other surface of the ceramic substrate 11 through screen printing or the like, laminating the ceramic substrate 11 and the aluminum sheet 23 through the Ag paste 227, and carrying out a heating treatment as illustrated in FIG. 6. In a case in which the ceramic substrate 11 and the aluminum sheet 23 are bonded together using the Ag paste 227, the pressure during the pressurization in the lamination direction is set in a range of 1 kgf/cm$^2$ (98 kPa) to 35 kgf/cm$^2$ (3430 kPa). In addition, the heating temperature and the heating time in the heating treatment are set in a range of 600° C. to 650° C. and in a range of 30 minutes to 360 minutes respectively.

In addition, in the above-described embodiments, the case in which the power module substrate and the heat sink are bonded together through the Al—Si-based brazing filler metal has been described, but the bonding method is not limited thereto, and the power module substrate and the heat sink may be bonded together through a fixation layer by applying, for example, the above-described transient liquid phase (TLP) bonding method. In addition, the power module substrate and the heat sink may be bonded together through the Ag paste containing Ag particles and an organic substance.

Furthermore, the heat sink including the flow paths for cooling has been described, but there is no particular limitation regarding the structure of the heat sink, and, for example, an air cooling-mode heat sink may be used. In addition, the heat sink may include a heat-dissipating fan.

EXAMPLES

Hereinafter, the results of a confirmation test carried out to confirm the effects of the present invention will be described.

First, a filler metal, an active metal material, and a copper sheet made of copper having a purity of 99.99% (37 mm×37 mm×0.3 mmt (thickness)), which are described in Table 1, are laminated on one surface of a ceramic substrate made of AlN (40 mm×40 mm×0.635 mmt), and an aluminum sheet (37 mm×37 mm×1.6 mmt) was laminated on the other surface of the ceramic substrate through a bonding material described in Table 1.

In each of Invention Examples 1 to 12 in which the position of the active metal was set on the copper sheet side, the ceramic substrate, the filler metal, the active metal material, and the copper sheet were laminated in this order, and, in Invention Example 13 in which the position of the active metal was set on the ceramic substrate side, the ceramic substrate, the active metal material, the filler metal, and the copper sheet were laminated in this order.

Regarding the bonding materials described in Table 1, "Al—Si" represents an Al-7.5 mass % Si brazing filler metal and, for "Cu (TLP)", Cu was used as the fixation layer. "Ag paste" represents Ag paste containing Ag particles and an organic substance.

In addition, the components were loaded and heated in a vacuum heating furnace in a state of being pressurized in the lamination direction at a pressure of 12 kgf/cm$^2$ (1176 kPa), whereby a copper sheet was bonded to one surface of the ceramic substrate, and an aluminum sheet was bonded to the other surface of the ceramic substrate, thereby forming a circuit layer and a metal layer on both surfaces of the ceramic substrate. The pressure in the vacuum heating furnace was set in a range of $10^{-6}$ Pa to $10^{-3}$ Pa, and the heating temperature and the heating time were set to the conditions described in Table 1. Therefore, a power module substrate was obtained.

Next, a heat sink was bonded to the other surface side of the metal layer in the above-described power module substrate. As the heat sink, an aluminum sheet made of A6063 (50 mm×60 mm×5 mmt) was used, and the heat sink was bonded using the method described in Table 1. Regarding the bonding methods of the heat sink described in Table 1, in "Al—Si", an Al-10.5 mass % Si brazing filler metal was used, in "Cu (TLP)", a Cu fixation layer was used, and, in "Ag paste", Ag paste containing Ag particles and an organic substance was used. The power module substrate and the ceramic substrate were bonded together in a vacuum atmosphere under conditions of a pressure of 12 kgf/cm$^2$ (1176 kPa), a heating temperature of 610° C., and a heating time of 60 minutes.

As described above, power module substrates with a heat sink of Invention Examples 1 to 13 were produced.

For the power module substrates with a heat sink of the invention examples obtained as described above, the bonding rates between the circuit layer and the ceramic substrate and the bonding rates between the metal layer and the ceramic substrate were evaluated. Furthermore, for the power module substrates with a heat sink, a thermal cycle test was carried out, and the bonding rates between the circuit layer and the ceramic substrate and the bonding rates between the metal layer and the ceramic substrate after the test were evaluated.

The testing method of the thermal cycle and the method for evaluating the bonding rates will be described below.

(Thermal Cycle Test)

In the thermal cycle test, a thermal shock chamber TSB-51 manufactured by ESPEC Corp. was used, and a temperature-change process in which the power module substrate with a heat sink was maintained in a liquid phase (fluorinert) under a temperature environment of −40° C. for five minutes, then, was heated up to 125° C., was maintained under the same temperature environment for five minutes, and, again, was returned to the temperature environment of −40° C. (one cycle) was carried out 3000 cycles.

(Evaluation of Bonding Rate)

For the power module substrates with a heat sink, the bonding rates in the interfaces between the ceramic substrate and the circuit layer and the bonding rates in the interfaces between the ceramic substrate and the metal layer were evaluated using an ultrasonic flaw detector and were computed using the following equation.

The initial bonding area refers to an area to be bonded before bonding, that is, the area of each of the circuit layer and the metal layer in the present embodiment. At ultrasonic flaws, exfoliation was observed at white portions in the bonding portion, and thus the area of these white portions was considered as the exfoliation area. In a case in which cracks were generated in the ceramic substrate, the circuit layer, and the metal layer, these cracks were observed at the white portions by the ultrasonic flaw detector, and the cracks were also evaluated using the exfoliation area.

$$\text{Bonding rate}(\%) = \frac{\text{(Initial bonding area)} - \text{(Exfoliation area)}}{\text{(Initial bonding area)}} \times 100 \quad \text{(Formula 1)}$$

The results of the above-described evaluations are described in Table 1 below.

TABLE 1

| | Components of filler metal | Thickness of filler metal μm | Melting point of filler metal | Type of active metal material | Thickness of active metal material μm | Position of active metal material |
|---|---|---|---|---|---|---|
| Invention Example 1 | Cu—6.3mass%P—9.3mass%Sn—7mass%Ni | 40 | 600° C. | Ti | 5 | Copper sheet side |
| Invention Example 2 | Cu—7mass%P—15mass%Sn—10mass%Ni | 40 | 580° C. | Ti | 5 | Copper sheet side |
| Invention Example 3 | Cu—7mass%P—15mass%Sn—10mass%Ni | 40 | 580° C. | Zr | 5 | Copper sheet side |
| Invention Example 4 | Cu—7mass%P—15mass%Sn—10mass%Ni | 40 | 580° C. | Nb | 5 | Copper sheet side |
| Invention Example 5 | Cu—7mass%P—15mass%Sn—10mass%Ni | 40 | 580° C. | Hf | 5 | Copper sheet side |
| Invention Example 6 | Sn—0.7mass%Cu—0.03mass%Ni—P | 100 | 217° C. | Ti | 15 | Copper sheet side |
| Invention Example 7 | Sn—7mass%Cu | 100 | 227° C. | Ti | 15 | Copper sheet side |
| Invention Example 8 | Al—33mass%Cu | 150 | 548° C. | Ti | 15 | Copper sheet side |
| Invention Example 9 | Cu—7mass%P—15mass%Sn—10mass%Ni | 40 | 580° C. | Ti | 3 | Copper sheet side |
| Invention Example 10 | Cu—7mass%P—15mass%Sn—10mass%Ni | 40 | 580° C. | Ti | 3 | Copper sheet side |
| Invention Example 11 | Cu—7mass%P—15mass%Sn—10mass%Ni | 40 | 580° C. | Ti | 3 | Copper sheet side |
| Invention Example 12 | Cu—7mass%P—15mass%Sn—10mass%Ni | 40 | 580° C. | Ti | 3 | Copper sheet side |
| Invention Example 13 | Cu—7mass%P—15mass%Sn—10mass%Ni | 40 | 580° C. | Ti | 3 | Ceramic substrate side |

| | Bonding material | Thickness of bonding material μm | Bonding method of heat sink | Heating conditions Temp. | Heating conditions Time | Initial bonding rate [%] Circuit layer | Initial bonding rate [%] Metal layer | Bonding rate after thermal cycle test [%] Circuit layer | Bonding rate after thermal cycle test [%] Metal layer |
|---|---|---|---|---|---|---|---|---|---|
| Invention Example 1 | Al—Si | 15 | Al—Si | 650° C. | 90 min. | 100 | 100 | 99.8 | 98.3 |
| Invention Example 2 | Al—Si | 15 | Al—Si | 650° C. | 90 min. | 99.8 | 100 | 98.4 | 99.4 |
| Invention Example 3 | Al—Si | 15 | Al—Si | 650° C. | 30 min. | 100 | 100 | 98.6 | 99.8 |
| Invention Example 4 | Al—Si | 15 | Al—Si | 650° C. | 120 min. | 100 | 100 | 99.0 | 99.2 |
| Invention Example 5 | Al—Si | 15 | Al—Si | 650° C. | 120 min. | 99.6 | 100 | 98.1 | 97.3 |
| Invention Example 6 | Al—Si | 15 | Al—Si | 600° C. | 360 min. | 98.2 | 99.8 | 93.8 | 95.3 |
| Invention Example 7 | Al—Si | 15 | Al—Si | 600° C. | 360 min. | 97.3 | 100 | 94.4 | 94.9 |
| Invention Example 8 | Al—Si | 15 | Al—Si | 600° C. | 45 min. | 98.6 | 100 | 94.2 | 94.8 |

TABLE 1-continued

| | | | | | | | | | |
|---|---|---|---|---|---|---|---|---|---|
| Invention Example 9 | Cu (TLP) | 0.2 | Al—Si | 630° C. | 180 min. | 100 | 100 | 98.2 | 96.3 |
| Invention Example 10 | Ag paste | 3 | Al—Si | 630° C. | 180 min. | 100 | 100 | 98.9 | 97.0 |
| Invention Example 11 | Al—Si | 15 | Cu | 630° C. | 180 min. | 100 | 100 | 99.3 | 95.5 |
| Invention Example 12 | Al—Si | 15 | Ag paste | 630° C. | 180 min. | 100 | 99.1 | 99.6 | 94.6 |
| Invention Example 13 | Al—Si | 15 | Al—Si | 650° C. | 90 min. | 99.7 | 98.9 | 91.6 | 97.5 |

In Invention Examples 1 to 13 in which the circuit layer and the metal layer were formed on both surfaces of the ceramic substrate at the same time using the filler metal having a melting point of 660° C. or lower, it was confirmed that power module substrates with a heat sink having a high initial bonding rate and capable of maintaining a high bonding rate even after the thermal cycle is loaded could be obtained.

REFERENCE SIGNS LIST

10 POWER MODULE SUBSTRATE
11 CERAMIC SUBSTRATE
12 CIRCUIT LAYER
13 METAL LAYER
22 COPPER SHEET
23 ALUMINUM SHEET
25 FILLER METAL
26 ACTIVE METAL MATERIAL
27, 127, 227 BONDING MATERIAL

INDUSTRIAL APPLICABILITY

The present invention relates to a method for manufacturing a power module substrate in which a copper sheet and an aluminum sheet can be simultaneously bonded to both surfaces of a ceramic substrate at low temperature and low manufacturing cost.

The invention claimed is:

1. A method for manufacturing a power module substrate including a ceramic substrate, a circuit layer formed of a copper sheet bonded onto one surface of the ceramic substrate, and a metal layer formed of an aluminum sheet bonded onto the other surface of the ceramic substrate, the method comprising:
   a first lamination step of laminating the copper sheet on the one surface of the ceramic substrate through an active metal material and a filler metal, the filler metal having a melting point of 600° C. or lower;
   a second lamination step of laminating the aluminum sheet on the other surface of the ceramic substrate through a bonding material; and
   a heating treatment step of heating the ceramic substrate, the copper sheet, and the aluminum sheet laminated together at a heating temperature of 650° C. or lower in a state of being pressurized in the lamination direction at 1 kgf/cm² to 35 kgf/cm², wherein
   the ceramic substrate and the copper sheet, and the ceramic sheet and the aluminum sheet are bonded at the same time, and
   the filler metal does not come into direct contact with the copper sheet.

2. The method for manufacturing a power module substrate according to claim 1, wherein
   the filler metal is disposed on the ceramic substrate and the active metal material is disposed on the copper sheet in the first lamination step.

3. The method for manufacturing a power module substrate according to claim 1, wherein
   the filler metal is a brazing filler metal having a liquidus temperature of 450° C. or higher.

4. The method for manufacturing a power module substrate according to claim 3, wherein
   the brazing filler metal is any one selected from the group of a Cu—P—Sn—Ni-based brazing filler metal, a Cu—Sn-based brazing filler metal, and a Cu—Al-based brazing filler metal.

5. The method for manufacturing a power module substrate according to claim 1, wherein
   the filler metal is a solder material having a liquidus temperature of lower than 450° C.

6. The method for manufacturing a power module substrate according to claim 5, wherein
   the solder material is a Cu—P—Sn—Ni-based solder material or a Cu—Sn-based solder material.

7. The method for manufacturing a power module substrate according to claims 1, wherein the active metal material is a Ti material.

8. The method for manufacturing a power module substrate according to claim 2, wherein
   the filler metal is a brazing filler metal having a liquidus temperature of 450° C. or higher.

9. The method for manufacturing a power module substrate according to claim 8, wherein
   the brazing filler metal is any one selected from the group of a Cu—P—Sn—Ni-based brazing filler metal, a Cu—Sn-based brazing filler metal, and a Cu-Al-based brazing filler metal.

10. The method for manufacturing a power module substrate according to claim 2, wherein
    the filler metal is a solder material having a liquidus temperature of lower than 450° C.

11. The method for manufacturing a power module substrate according to claim 10, wherein
    the solder material is a Cu—P—Sn—Ni-based solder material or a Cu—Sn-based solder material.

12. The method for manufacturing a power module substrate according to claim 1, wherein the heating temperature in the heating treatment step is 600° C. or higher.

13. A method for manufacturing a power module substrate including a ceramic substrate, a circuit layer formed of a copper sheet bonded onto one surface of the ceramic substrate, and a metal layer formed of an aluminum sheet bonded onto the other surface of the ceramic substrate, the method comprising:
- a first lamination step of laminating the copper sheet on the one surface of the ceramic substrate through an active metal material and a filler metal, the filler metal having a melting point of 600° C. or lower;
- a second lamination step of laminating the aluminum sheet on the other surface of the ceramic substrate through a bonding material; and
- a heating treatment step of heating the ceramic substrate, the copper sheet, and the aluminum sheet laminated together at a heating temperature of 650° C. or lower, wherein
- the ceramic substrate and the copper sheet, and the ceramic sheet and the aluminum sheet are bonded at the same time;
- wherein at the first lamination step of laminating the active metal material is disposed on the copper sheet, and the filler metal is disposed on the ceramic substrate;
- the active metal material is selected from a group consisting of one or more active elements of Ti, Zr, Nb, and Hf, and
- the filler metal does not come into direct contact with the copper sheet.

14. The method for manufacturing a power module substrate according to claim 13,
wherein the filler metal is a brazing filler metal having a liquidus temperature of 450° C. or higher.

15. The method for manufacturing a power module substrate according to claim 14,
wherein the brazing filler metal is any one selected from the group of a Cu—P—Sn—Ni-based brazing filler metal, a Cu—Sn-based brazing filler metal, and a Cu—Al-based brazing filler metal.

16. The method for manufacturing a power module substrate according to claim 13,
wherein the filler metal is a solder material having a liquidus temperature of lower than 450° C.

17. The method for manufacturing a power module substrate according to claim 16,
wherein the solder material is a Cu—P—Sn—Ni-based solder material or a Cu—Sn-based solder material.

18. The method for manufacturing a power module substrate according to claims 13,
wherein the active metal material is a Ti foil.

19. The method for manufacturing a power module substrate according to claim 13,
wherein the thickness of the active metal material is in a range of 1 μm to 20 μm.

20. The method for manufacturing a power module substrate according to claim 13,
wherein the brazing filler metal is any one selected from the group consisting of a Cu—P—Sn—Ni-based brazing filler metal, a Cu—Sn-based brazing filler metal, and a Cu—Al-based brazing filler metal and the bonding material is an Al—Si-based brazing filler metal.

* * * * *